United States Patent
Melanson

(10) Patent No.: US 7,298,305 B2
(45) Date of Patent: Nov. 20, 2007

(54) DELTA SIGMA MODULATOR ANALOG-TO-DIGITAL CONVERTERS WITH QUANTIZER OUTPUT PREDICTION AND COMPARATOR REDUCTION

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 25 days.

(21) Appl. No.: 11/388,397

(22) Filed: Mar. 24, 2006

(65) Prior Publication Data
US 2007/0222656 A1 Sep. 27, 2007

(51) Int. Cl.
*H03M 3/00* (2006.01)
(52) U.S. Cl. .................. 341/143; 341/155; 704/222
(58) Field of Classification Search ........ 341/143–170; 704/220–230
See application file for complete search history.

(56) References Cited

U.S. PATENT DOCUMENTS

| | | | | |
|---|---|---|---|---|
| 4,470,146 A | 9/1984 | Yatsuzuka et al. | ............ | 375/30 |
| 4,649,371 A | 3/1987 | Kolluri | ............ | 340/347 |
| 4,918,623 A * | 4/1990 | Lockitt et al. | ............ | 709/224 |
| 5,208,594 A | 5/1993 | Yamazaki | ............ | 341/143 |
| 5,870,052 A | 2/1999 | Dedic et al. | ............ | 341/161 |
| 6,215,427 B1 | 4/2001 | Bonhoure et al. | ............ | 341/118 |
| 6,239,734 B1 | 5/2001 | Bae et al. | ............ | 341/164 |
| 6,380,881 B2 | 4/2002 | Harada et al. | ............ | 341/165 |
| 6,642,873 B1 | 11/2003 | Kuang | ............ | 341/143 |
| 6,717,542 B2 | 4/2004 | Harada | ............ | 341/161 |
| 6,809,674 B1 | 10/2004 | Ramsden | ............ | 341/155 |
| 6,919,837 B2 | 7/2005 | Harada et al. | ............ | 341/163 |
| 7,058,463 B1 | 6/2006 | Ruha et al. | ............ | 700/94 |
| 7,116,260 B2 | 10/2006 | Luh | ............ | 341/155 |
| 7,209,878 B2 * | 4/2007 | Chen | ............ | 704/220 |
| 7,221,303 B1 * | 5/2007 | Melanson | ............ | 341/143 |
| 2003/0179124 A1 | 9/2003 | Harada | ............ | 341/161 |
| 2006/0077090 A1 | 4/2006 | Schimper | ............ | 341/155 |

FOREIGN PATENT DOCUMENTS

| | | |
|---|---|---|
| EP | 0402149 A2 | 12/1990 |
| WO | WO2005011126 | 3/2005 |

OTHER PUBLICATIONS

International Search Report and Written Opinion for PCT/US2007/063660 dated Jul. 26, 2007.

\* cited by examiner

*Primary Examiner*—Lam T. Mai
(74) *Attorney, Agent, or Firm*—Hamilton & Terrile, LLP; Kent B. Chambers

(57) ABSTRACT

The quantizers of delta sigma modulators in the signal processing systems described herein use a reduced set of comparators for quantization by predetermining and maintaining a maximum per cycle deviation d between a loop filter output signal $V_{LF}(t)$ and a predicted quantizer output signal $q_{est}$. In at least one embodiment, a maximum quantizer level deviation d is defined in terms of a number of quantization levels. Thus, the number of comparators in a quantizer needed to quantize the quantizer input signal $V_{in}(t)$ is based on the maximum quantizer level deviation d. In addition to using fewer comparators than available quantization output levels N, the quantizers can use an even number of comparators M, in contrast to comparable conventional reduced comparator ADC tracking quantizer designs using M+1 number of comparators, where N and M are integers and M<N.

36 Claims, 8 Drawing Sheets

DELTA SIGMA MODULATOR ANALOG-TO-DIGITAL CONVERTERS WITH QUANTIZER OUTPUT PREDICTION AND COMPARATOR REDUCTION

CROSS-REFERENCED PATENT APPLICATIONS

This patent application cross-references U.S. application Ser. No. 11/388,436 entitled "Delta Sigma Modulators with Comparator Offset Noise Conversion" by inventor John Melanson, filed on Mar. 24, 2006 and U.S. application Ser. No. 11/388,425 entitled "Delta Sigma Modulator Analog-to-Digital Converters with Multiple Threshold Comparisons during a Delta Sigma Modulator Output Cycle" by inventor John Melanson, filed on Mar. 24, 2006, now U.S. patent application Ser No. 7,221,303, issued on May 22, 2007.

BACKGROUND OF THE INVENTION

1. Field of the Invention

The present invention relates in general to the field of information processing, and more specifically to a signal processing system and method for reducing comparators in delta sigma modulator, analog-to-digital comparators using quantizer output prediction.

2. Description of the Related Art

Many signal processing systems include delta sigma modulators to quantize an input signal into one or more bits. Delta sigma modulators trade-off increased noise in the form of quantization error in exchange for high sample rates and noise shaping. "Delta-sigma modulators" are also commonly referred to using other interchangeable terms such as "sigma-delta modulators", "delta-sigma converters", "sigma delta converters", and "noise shapers".

FIG. 1 depicts an analog-to-digital converter (ADC) delta sigma modulator 100 that receives an analog input signal x(t) and converts the input signal x(t) into a series of low resolution, digital output pulses q(n), where t represents a continuous time variable and n denotes a discrete time variable. The average amplitude over time of the series of low resolution pulses is q(n). In general, the delta sigma modulator 100 quantizes a difference between the current input signal x(t) and an analog version of the previous quantizer output signal, i.e. q(t−1). In the feedback loop of delta sigma modulator 100, a digital-to-analog converter (DAC) 108 converts each delayed ($z^{-1}$) output signal q(n−1) into an analog signal q(t−1). The feedback loop of delta sigma modulator 100 also includes dynamic element matching 106 to correct nonlinearities in the DAC 108 signal q(n−1).

The noise shaping loop filter 102 processes a difference between input signal x(t) and the delayed output signal q(t−1) to generate a loop filter output signal/quantizer input signal $V_{LF}$. During each output cycle of delta sigma modulator operation, quantizer 104 quantizes signal $V_{LF}$ to generate output signal q(n), generally in the form of digital data. When loop filter 102 is a continuous time filter, the quantizer 104 represents a relatively low-accuracy ADC converter operating at an oversampling rate, such as a rate of 64:1. Quantizer 104 can provide multi-bit or one-bit output quantization levels. The quantization level step size, Δ, represents the difference between each quantization level. One-bit quantizers have only two quantization levels specified as {−α/2, α/2} or {−1,1}. Shreier and Temes, *Understanding Delta-Sigma Signal Converters*, IEEE Press, 2005 (referred to herein as "Shreier & Temes") describes conventional delta-sigma modulators in more detail.

Multi-bit ADC delta sigma modulators exhibit some well-known advantages over single bit ADC delta sigma modulators such as reduced quantization noise. However, quantizer design continues to represent one of the significant challenges confronting delta sigma modulator designers.

FIG. 2 depicts a flash-type quantizer 200, which represents one embodiment of quantizer 104. Quantizer 200 includes r comparators 202.0-202.r−1, each having a first input connected to the output of loop filter 102 to receive quantizer input signal $V_{LF}$. "r" is a positive integer representing the number of comparators in delta sigma modulator 100. Each of the comparators 202.0-202.r−1 includes a second input to receive respective reference voltages $V_0$ through $V_{r-1}$. The reference voltages serve as reference signals to quantize the quantizer input signal $V_{LF}$. A resistor string reference ladder of r−1 resistors 204.1-204.r−1 of value R generates uniform voltage drops across at least reference resistors 204.1-204.r−1 to generate respective reference voltages $V_0$ through $V_{r-1}$. The end resistors 204.0 and 204.r have values that can be used to scale the quantization levels (also referred to as a "quantizer step"). For example, the largest quantizer threshold may be 1.2 V, but the available reference may be 2.5 V, so resistors 204.0 and 204.r are set to achieve the desired scale. A reference voltage of +Vref to −Vref is applied across the reference resistors 204.0-204.r. +/−Vref is, for example, +/−1.5 Volts (V).

Each of comparators 202.0-202.r−1 compares the quantizer input signal $V_{LF}$ with respective reference voltages $V_0$ through $V_{r-1}$. The $i^{th}$ comparator 202.i generates a logical zero (e.g. 0 V) when the $i^{th}$ reference voltage $V_i$ is less than or equal to the loop filter output/quantizer input signal $V_{LF}$ and a logical one (e.g. +2.5 V) when $V_i > V_{LF}$. Once during each cycle of quantizer 104 operation, digital encoder 206 encodes the output signals of comparators 202.0-202.r−1 into a digital (discrete) output signal q(n).

Increasing the number of comparators in quantizer 104, i.e. increasing the value of r, yields a higher quality output signal q(n) (e.g. less quantization noise) and higher signal bandwidth capabilities. Each time r doubles, delta sigma modulator 100 typically achieves a 6 dB quantization noise improvement. However, disadvantages also accompany increasing the number of comparators in quantizer 104. For example, increasing the number of comparators requires more physical area to implement and more power to operate. Additionally, increasing the number of comparators decreases voltage spacing between adjacent reference voltages $V_i$ and $V_{i+1}$ and increases the relative effects of non-idealities, such as comparator offset voltages.

Comparator offset voltages represent the minimum direct current (DC) input voltage that would have to be applied to input terminals of the comparator to cause the comparator to transition state. Thus, comparator offset voltages can cause error in the comparator outputs, especially when the difference between the reference input signals of adjacent comparators is small. Accordingly, as the relative effects of quantizer non-idealities increase, the nonidealities cause increasing delta sigma modulator error. The non-linearity can cause harmonic distortion, especially at high signal frequencies, increased noise, and modulation of noise with the direct current (DC) input level, all of which are undesirable.

An example with the number of comparators equal to r=16 illustrates effects of comparator nonidealities. Assuming seventeen (17) quantization levels, normalized to −8, −7, −6, . . . , −1, 0, +1, +2, . . . , +8, the input reference voltages $V_0$ through $V_{15}$ to respective comparators 202.0-202.r−1 are normalized values of −7.5, −6.5, −5.5, . . . , −0.5, +0.5, . . . , +5.5, +6.5, +7.5. Each actual reference voltage $V_i$ scales with the analog system reference voltage $V_{ref}$. For example, if level −8 corresponds to −1.5 V and level +8 corresponds to +1.5 V, then the respective comparator input voltage references $V_0$ through $V_{15}$ for comparators 202.0-202.r-1 are −7.5/8*1.5, −6.5/8*1.5, . . . , +6.5/8*1.5, and +7.5/ 8*1.5V. Thus, as the number of comparators increases the voltage reference spacing decreases. It follows that as the number of comparators increases, eventually non-linearities of the flash-type quantizer 200 counteract any advantage obtained by increasing the number of comparators. Additionally, in an integrated circuit, chip area is valuable. Increasing the number of comparators requires more chip area and, thus, can become a dominant disadvantage.

FIG. 3 depicts a tracking ADC quantizer 300, which represents another embodiment of quantizer 104. The tracking ADC quantizer 300 is described in detail in Dorrer et al., A 3-*mW* 74-*dB SNR* 2-*MHz Continuous-Time Delta-Sigma ADC With a Tracking ADC Quantizer in* 0.13-*μm CMOS*, IEEE Journal of Solid-State Circuits, Vol. 40, No. 12, December 2005. The quantizer 300 reduces the number of comparators to three comparators 302.0, 302.1, and 302.2, a counter 304, an R-string reference ladder 306, and a switching matrix 308 to connect the reference voltages $V_0$, $V_1$, and $V_2$ to the inputs of comparators 302.0, 302.1, and 302.2. When the loop filter 102 output voltage $V_{LF}$ has a value of 1 least significant bit (LSB) or less, only the middle comparator 302.1 will change state, and the state of counter 304 remains unchanged. For $V_{LF}$ signal changes larger than 1 LSB, adjacent comparators 302.2 or 302.0 will change state depending upon whether the change is greater than or less than the previous state. The logic 310 detects this state change and increases the output of counter 304 or decreases the output of counter 304 depending upon whether comparator 302.2 or 302.0 changed state. By changing the state of counter 304, the reference voltages $V_0$, $V_1$, and $V_2$ to respective comparators 302.0, 302.1, and 302.2 are tracked to the new output value of counter 304. In each cycle of operation of delta sigma modulator 300, the output signal q(n) of quantizer 300 is generated by using the result of counter 304 and the output signal of comparators 302.0, 302.1, and 302.2.

Despite developments in quantizer technology, ADC delta sigma modulator quantizer design can still be improved to reduce the number of comparators used in comparable ADC delta sigma modulator quantizer designs and the effects of comparator non-idealities.

SUMMARY OF THE INVENTION

In one embodiment of the present invention, a signal processing system includes an analog-to-digital delta sigma modulator. The analog-to-digital delta sigma modulator includes a quantizer output predictor. The quantizer output predictor includes a low pass filter to generate a predicted quantizer output signal, wherein the predicted quantizer output signal is an estimate of a quantizer input signal for time t based upon at least one or more previous delta sigma modulator output signals. The delta sigma modulator also includes a loop filter to generate a loop filter output signal for time t. The delta sigma modulator also includes a quantizer, coupled to the loop filter, to generate a quantizer output signal based on the quantizer input signal, wherein the quantizer input signal comprises a difference between the loop filter output signal for time t and the predicted quantizer output signal for time t.

In another embodiment of the present invention, a method of processing a signal using an analog-to-digital delta sigma modulator includes generating a predicted quantizer output signal with a low pass filter, wherein the predicted quantizer output signal is an estimate of a quantizer input signal for time t based upon at least one or more previous delta sigma modulator output signals. The method also includes generating a loop filter output signal for time t. The method further includes generating a quantizer output signal based on the quantizer input signal, wherein the quantizer input signal comprises a difference between the loop filter output signal for time t and the predicted quantizer output signal for time t.

In a further embodiment of the present invention, a signal processing system includes an analog-to-digital delta sigma modulator. The delta sigma modulator includes an input to receive an input signal and a filter coupled to the input. The delta sigma modulator further includes a quantizer coupled to the filter to quantize an output of the filter. The quantizer further includes M comparators, wherein each comparator is configured (i) to receive the input signal, (ii) to receive a respective reference signal that approximates the input signal, and (iii) generate comparison data representing a comparison between the input signal and the received reference signal, wherein M is an even integer and M≧2, an N-level reference signal generator, coupled to the M-comparators, to (i) generate each respective reference signal based on content of the comparison data and (ii) provide each respective reference signal to the M comparators, wherein N is an integer and N>M. In at least one embodiment, N>M+2.

In another embodiment of the present invention, a method includes receiving a quantizer input signal with first inputs of M comparators of a quantizer of an analog-to-digital delta sigma modulator, wherein M is an even integer and M≧2. The method further includes receiving a respective reference signal on each of second inputs of the M comparators and generating comparison data with each of the M-comparators representing a comparison between the quantizer input signal and the respective reference signal. The method also includes generating each reference signal, wherein the reference signal is based on content of the comparison data, the reference signal has one of N possible levels for each comparison, and N is an integer and N>M.

In a further embodiment of the present invention, an apparatus includes means for receiving a quantizer input signal with first inputs of M comparators of a quantizer of an analog-to-digital delta sigma modulator, wherein M is an even integer and M≧2. The apparatus also includes means for receiving a respective reference signal on each of second inputs of the M comparators and means for generating comparison data with each of the M-comparators representing a comparison between the quantizer input signal and the respective reference signal. The apparatus further includes means for generating each reference signal, wherein the reference signal is based on content of the comparison data, the reference signal has one of N possible levels for each comparison, and N is an integer and N>M.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The quantizers of delta sigma modulators in the signal processing systems described herein use a reduced set of comparators for quantization by predetermining and maintaining a maximum per cycle deviation d between a loop filter output signal $V_{LF}(t)$ and a predicted quantizer output signal $q_{est}$. In at least one embodiment, a maximum quantizer level deviation d is defined in terms of a number of quantization levels. Thus, the number of comparators in a quantizer needed to quantize the quantizer input signal $V_{in}(t)$ is based on the maximum quantizer level deviation d.

In at least one embodiment, the predicted quantizer output signal $q_{est}$ is based on previous quantizer output signals. The predicted quantizer output signal $q_{est}$ is effectively subtracted from the loop filter output signal $V_{LF}(t)$ to generate a quantizer input signal $V_{in}(t)$. In at least one embodiment, the predicted quantizer output signal $q_{est}$ is designed to ensure that the resulting quantizer input signal $V_{in}(t)$ is in the range of -d to +d. Quantization of the quantizer input signal $V_{in}(t)$ generates a preliminary quantizer output signal c(n) based on the output signals of the comparators of the quantizer. The delta sigma modulator generates a final delta sigma modulator (DSM) output signal q(n) by adding predicted quantizer output signal $q_{est}$ to the preliminary quantizer output signal c(n).

In addition to using fewer comparators than available quantization output levels N, in at least one embodiment, the quantizers use an even number of comparators M, in contrast to comparable conventional reduced comparator ADC tracking quantizer designs using M+1 number of comparators, where N and M are integers and M<N. An even number of comparators provides comparator reduction efficiencies over the conventional 'odd-number' comparator reduction design while obtaining equivalent quantization results.

Figure 1:
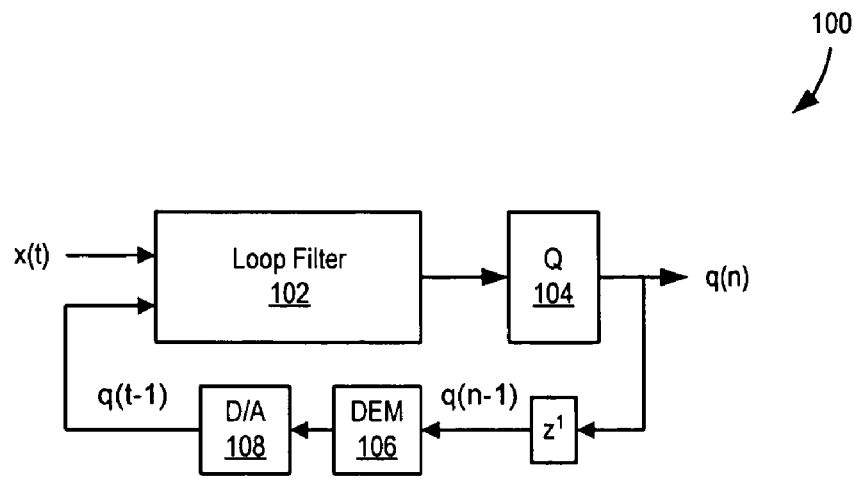
FIG. 1 (labeled prior art) depicts an analog-to-digital converter (ADC) delta sigma modulator.
Figure 2:
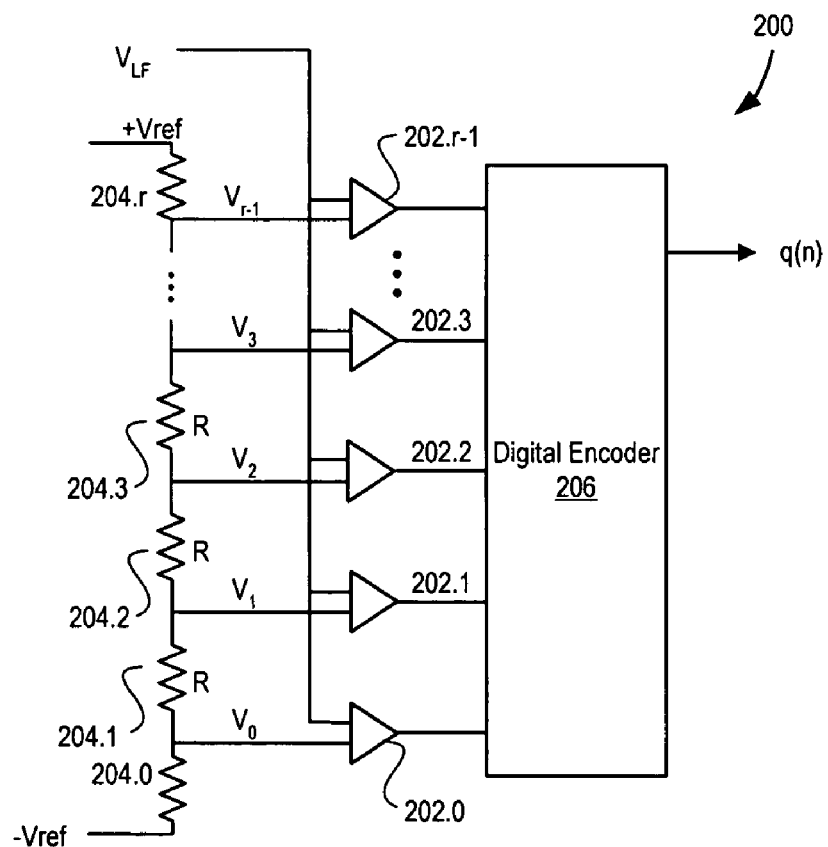
FIG. 2 (labeled prior art) depicts a flash-type quantizer of a delta sigma modulator.
Figure 3:
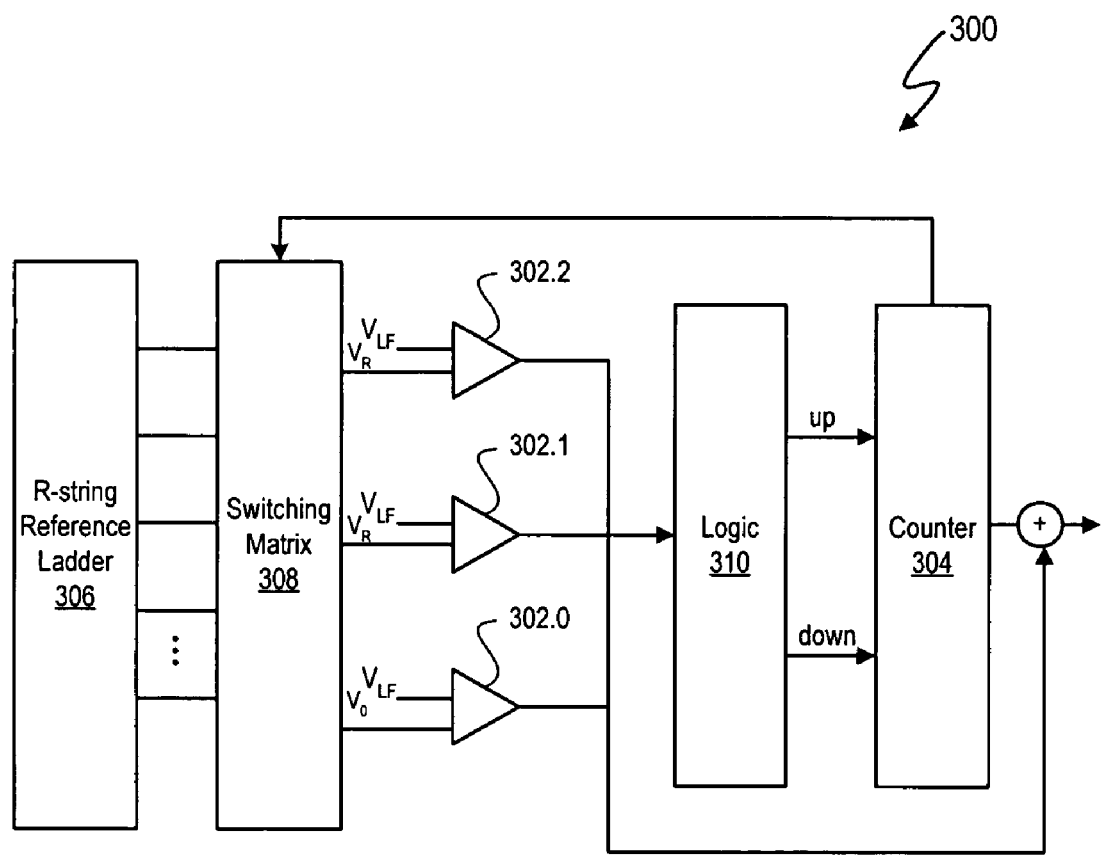
FIG. 3 (labeled prior art) depicts a tracking ADC quantizer.
Figure 4:
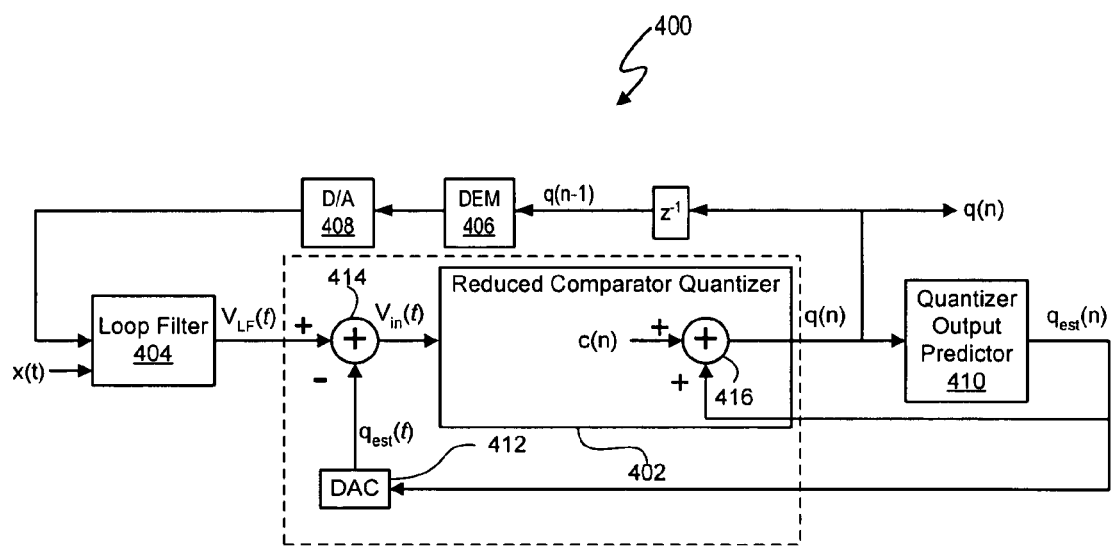
FIG. 4 depicts one embodiment of a reduced comparator delta sigma modulator.

FIG. 4 depicts one embodiment of a reduced comparator delta sigma modulator 400 that includes a reduced comparator quantizer 402 to quantize an output signal $V_{LF}(t)$ of loop filter 404. In one embodiment, loop filter 404 is $j^{th}$ order analog filter, where j is an integer greater than one (1). The quantizer output signal $q(n)z^{-1}$ (i.e. q(n-1) is fed back through optional dynamic element matching elements (DEMs) 406 and digital-to-analog converter (DAC) 408 to generate a feedback loop filter input signal q(t-1)). Loop filter 404 provides noise shaping to a difference between delta sigma modulator input signal x(t) and q(t-1). Embodiments of loop filter 404, DEMs 406, and DAC 408 are described in more detail in *Shreier & Temes*.

Delta sigma modulator 400 includes a quantizer output predictor 410 to generate the predicted quantizer output signal $q_{est}$. In at least one embodiment, the quantizer output predictor 410 is a digital low pass filter. The quantizer output predictor 410 can be either a finite infinite response (FIR) filter or an infinite impulse response (IIR) filter. Generally, for optimal delta sigma modulator performance, the filter function of the quantizer output predictor 410 is matched to the noise transfer function (NTF) of the loop filter 404. The quantizer output predictor 410 is preferably designed to generate a predicted quantizer output signal $q_{est}$. The value of predicted quantizer output signal $q_{est}$ generally ensures that the quantizer input signal $V_{in}(t)$ is in the range of -d to +d. "d" represents a maximum quantizer level deviation between predicted quantizer output signal $q_{est}$ and loop filter output signal $V_{LF}(t)$. In at least one embodiment, the maximum quantizer level deviation d is defined in terms of a number of quantization levels. However, if the quantizer only rarely steps by an amount that exceeds +/-d (for example, when d≈floor(d)), then it may be acceptable to use only a number of comparators intended to quantize quantizer input signal $V_{in}(t)$+/-d. Some performance degradation can be expected and can be determined by simulation.

The quantizer output predictor 410 can be a relatively simple or an optimized filter. However, it has been found that relatively simple low pass filters perform nearly as well as optimized filters. The following low pass filters have been determined to perform well for delta sigma modulator 400:

$$LPF = \frac{q(n-1) + q(n-2)}{2}, \quad \text{[Filter 1]}$$

$$LPF = \frac{q(n-1) + q(n-2) + q(n-3) + q(n-4)}{4}, \quad \text{[Filter 2]}$$

$$LPF = \frac{1}{8}q(n-1) + \frac{7}{8}LPF(n-1), \text{ and} \quad \text{[Filter 3]}$$

$$LPF = \frac{1}{8}q(n-2) + \frac{7}{8}LPF(n-1). \quad \text{[Filter 4]}$$

where "LPF" is the low pass filter output, wherein "LPF" is the low pass filter output, "q(n-k)" represents the quantizer output signal immediately preceding quantizer output signal q(n-(k-1)), wherein k is an integer representing the amount of delay. For example, "q(n-1)" represents the quantizer output signal immediately preceding quantizer output signal q(n), "q(n-2)" represents the quantizer output signal immediately preceding q(n-1), and so on. Filters [1] and [2] are exemplary FIR filters, and filters [3] and [4] are exemplary IIR filters. Minimizing the time to obtain the low pass filter output LPF is advantageous since in a real time signal processing environment, the delta sigma modulator 400 has only a limited amount of time to determine a quantization output signal q(n). Filter [4] can determine the low pass filter LPF output in only two delta sigma modulator output cycles and, thus, is useful for pipelined delta sigma modulator embodiments.

Many other simple and optimized filters can be used with coefficients that allow the filters to closely match the NTF of loop filter 404 and ensure a maximum quantizer level deviation d that reduces the number of comparators in reduced comparator quantizer 402 to a number that is less than the number of quantization levels. The coefficient choices may be varied. For example, for the IIR filters, ⅛ and ⅞ may be changed to respectively ¹⁄₁₆ and ¹⁵⁄₁₆, ¼ or ¾, and so on to obtain the best observed performance. Utilizing the immediately prior quantizer output signal q(n÷1) is the simplest predictor to implement. However, using subsequent quantizer output signals to determine predicted quantizer output signal $q_{est}$, as set forth in filters [1]-[4], reduce the range of quantizer input signal $V_{in}(t)$ possibilities and, thus, the number of comparators used by reduced comparator quantizer 402.

After generation of each quantizer output signal q(n), quantizer output predictor 410 generates a digital predicted quantizer output signal $q_{est}(n)$. In at least one embodiment, the predicted quantizer output signal $q_{est}$=floor(LPF+0.5) for an even number of comparators in reduced comparator quantizer 402, and $q_{est}$=floor(LPF) for an odd number of comparators in reduced comparator quantizer 402, where LPF is the low pass filter output of the quantizer output predictor 410. The "floor" function truncates the operand down to the nearest integer. For example, floor(7.9)=7, floor(7.4)=7, and so on. The function "floor(x+0.5)" is a rounding function. For an even number of comparators, the reduced comparator quantizer 402 has an odd number of possible preliminary quantizer outputs c(n). The rounding function allows the comparators of reduced comparator quantizer 402 to center around the predicted quantizer input signal $V_{ins}(t)$.

The predicted quantizer output signal $q_{est}(n)$ is fed back to DAC 412 to generate an analog predicted quantizer output signal $q_{est}(t)$. Computation module 414, such as an analog summer, determines the quantizer input signal $V_{in}(t)$ from the loop filter output signal $V_{LF}(t)$ minus the predicted quantizer output signal $q_{est}(t)$, i.e. $V_{in}(t)=V_{LF}(t)-q_{est}(t)$. In at least one embodiment, the reduced comparator quantizer 402 quantizes quantizer input signal $V_{in}(t)$ to generate a preliminary quantizer output signal c(n). The preliminary quantizer output signal c(n) is corrected by the predicted quantizer output signal $q_{est}(n)$, whose analog version $q_{est}(t)$ was subtracted from loop filter output signal $V_{LF}(t)$ to generate quantizer input signal $V_{in}(t)$. Delta sigma modulator 400 includes a digital summing module 416 to generate the final quantizer output signal q(n) by adding the preliminary quantizer output signal c(n) to the predicted quantizer output signal $q_{est}(n)$.

In at least one embodiment, to determine the maximum quantizer level deviation d, a simulator simulates delta sigma modulator 400 using multiple values of input signal x(t). The values of input signal x(t) chosen for simulation are values that will induce the largest deviations between successive quantizer input signals. In at least one embodiment, quantization of a full range of input signals x(t) are simulated in operation 502. After each loop filter output signal $V_{LF}(t)$ is generated, loop filter output signal $V_{LF}(t)$ is compared to predicted quantizer output signal $q_{est}(t)$ for each time t. In at least one embodiment, the number of comparators M to perform quantization in reduced comparator quantizer 402 is set forth in Equation [1]:

$$M = \text{ceiling}(2*d) \quad \text{[Equation 1]}$$

where M is the number of comparators in reduced comparator quantizer 402, d is the maximum quantizer level deviation determined during simulation, and the "ceiling(x)" function rounds the operand "x" up to the nearest integer. For example, ceiling(7.4)=8, ceiling(7.9)=8, and so on.

Table 1 sets forth some examples of the number of comparators for reduced comparator quantizer 402 based on various values of maximum quantizer level deviation d and M=ceiling(2*d):

TABLE 1

| Maximum Quantizer Level Deviation d | (2 * d) | Number of Comparators M = ceiling(2 * d) |
|---|---|---|
| 1.1 | 2.2 | 3 |
| 1.6 | 3.2 | 4 |
| 0.6 | 1.2 | 2 |

In other embodiments, fewer comparators than indicated by Equation [1] can be used. For example, if the quantizer only rarely steps by 2, it may be acceptable to use only 2 comparators, which corresponds to +/−d=+/−1. Some performance degradation can be expected and can be determined by simulation.

Figure 5:
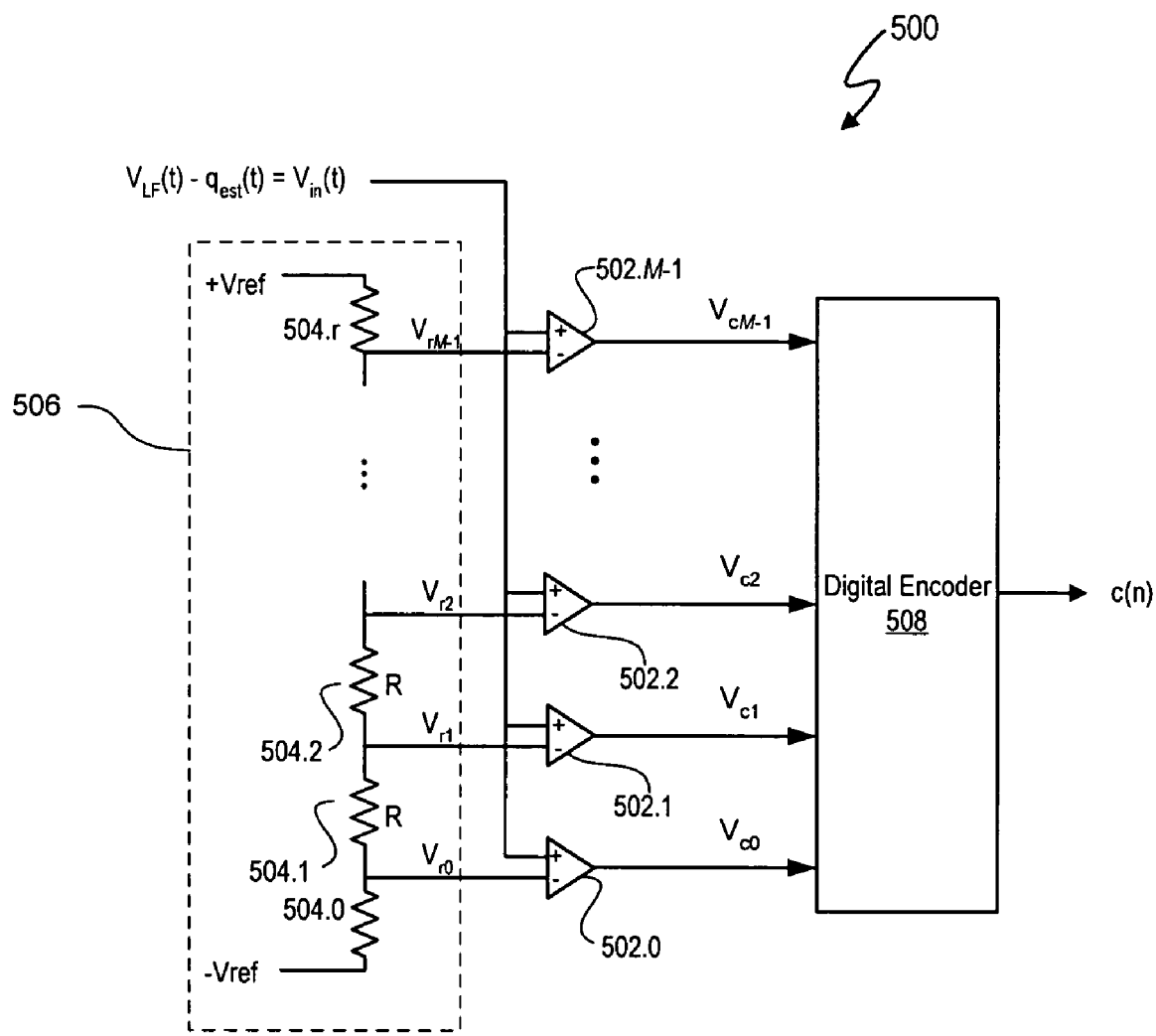
FIG. 5 depicts a reduced comparator quantizer.

FIG. 5 depicts quantizer 500, which represents one embodiment of reduced comparator quantizer 402. Each of comparators 502.0 through 502.M−1 ("502.0-502.M−1") includes an input terminal to receive quantizer input voltage $V_{in}(t)=V_{LF}(t)-q_{est}(t)$. The comparators 502.0-502.M−1 also each include an input terminal to receive a respective reference signal $V_{r0}, V_{r1}, \ldots, V_{rM-1}$. During each delta sigma modulator output cycle, the comparators 502.0-502.M−1 compare the quantizer input signal $V_{in}(t)$ to the respective reference signals generated by reference signal generator 506.

Upon each comparison between the quantizer input signal $V_{in}(t)$ and reference signals $V_{r0}, V_{r1}, \ldots, V_{rM-1}$, comparators 502.0 through 502.M−1 provide respective comparator output signals $V_{c0}, V_{c1}, \ldots, V_{cM-1}$ (collectively referred to as "comparison data") that represent the outcome of the respective comparisons. In at least one embodiment, the comparator output signal $V_{ci}$ of the $i^{th}$ comparator 502.i is a logical one (1) if the input signal $V_{in}(t)$ is greater than the reference signal provided to the $i^{th}$ comparator 502.i, and is a logical zero (0) if the input signal $V_{in}$ is less than or equal to the reference signal provided to the $i^{th}$ comparator 502.i, where $i \in \{0, 1, \ldots, M-1\}$.

For quantizer 500, in at least one embodiment, for an even number of comparators, the values of reference signals are +/−0.5 for the center two comparators with step sizes of +/1 between adjacent comparators. For example, for M=4 comparators, $V_{r0}, V_{r1}, V_{r2}$, and $V_{r3}$ in terms of normalized quantization levels are respectively −1.5, −0.5, +0.5, +1.5. For M=6 comparators, $V_{r0}, V_{r1}, V_{r2}, V_{r3}, V_{r4}$, and $V_{r5}$ are respectively −2.5, −1.5, −0.5, +0.5, +1.5, and +2.5. In at least one embodiment, for an odd number of comparators, the values of the center comparator is +0.5 with step sizes of +/1 between adjacent comparators. For example, for M=3 comparators, $V_{r0}, V_{r1}$, and $V_{r2}$, are respectively −0.5, +0.5, +1.5. For M=5 comparators, $V_{r0}, V_{r1}, V_{r2}, V_{r3}$, and $V_{r4}$ are respectively −1.5, −0.5, +0.5, +1.5, and +2.5.

To generate the reference signals $V_{r0}, V_{r1}, \ldots, V_{rM-1}$, a reference voltage of +Vref to −Vref is applied across the reference resistors 504.0-504.M. "+/−Vref" is, for example, +/−1.5 Volts (V). The reference resistors 504.0-504.M are preferably designed, as understood by those of ordinary skill in the art, to have differential non-linearity and integral non-linearity characteristics that are acceptable for the intended use of reduced comparator quantizer 402. In other embodiments, reference signal generator 506 uses other types of impedances, such as capacitors, or other circuit component types to generate the selected reference signals $V_{r0}, V_{r1}, \ldots, V_{rM-1}$. In at least one embodiment, the reference signals are generated upon request using configurable components.

The reduced comparator quantizer 402 includes a digital encoder 508 to (i) receive the comparator output signals $V_{c0}$, $V_{c1}, \ldots, V_{cM-1}$ and (ii) encode the comparator output signals $V_{c0}, V_{c1}, \ldots, V_{cM-1}$ as the preliminary quantizer output signal c(n). The value of preliminary quantizer output signal c(n) is in terms of relative quantization levels and is determined by comparison of quantizer input signal $V_{in}(t)$ to the comparator output signals $V_{c0}, V_{c1}, \ldots, V_{cM-1}$. Table 2 sets forth exemplary determinations of preliminary quantizer output signal c(n) for $V_{r0}=-0.5$ and $V_{r1}=+0.5$ and M=2 comparators in reduced comparator quantizer 402:

TABLE 2

| $V_{c0}$ | $V_{c1}$ | c(n) |
|---|---|---|
| +1 | +1 | +1 |
| +1 | 0 | 0 |
| 0 | 0 | −1 |

In at least one embodiment, the digital encoder 508 is a base 1 to base 2 (unary to binary) encoder. Delta sigma modulator 400 adds the predicted quantizer output signal $q_{est}(n)$ to c(n) to determine quantizer output signal q(n), as described above. Additionally, any offset can be used for preliminary quantization output signal c(n) and compensated for by reduced comparator quantizer 402.

In at least one embodiment, reduced comparator quantizer 402 uses an even number of comparators 502.0-502.M−1 to exploit expected per cycle input signal $V_{in}$ deviations. Thus, using an even number of comparators 502.0-502.M−1 provides comparator reduction efficiencies over the conventional 'odd-number' comparator reduction design while obtaining equivalent quantization results.

Figure 6:
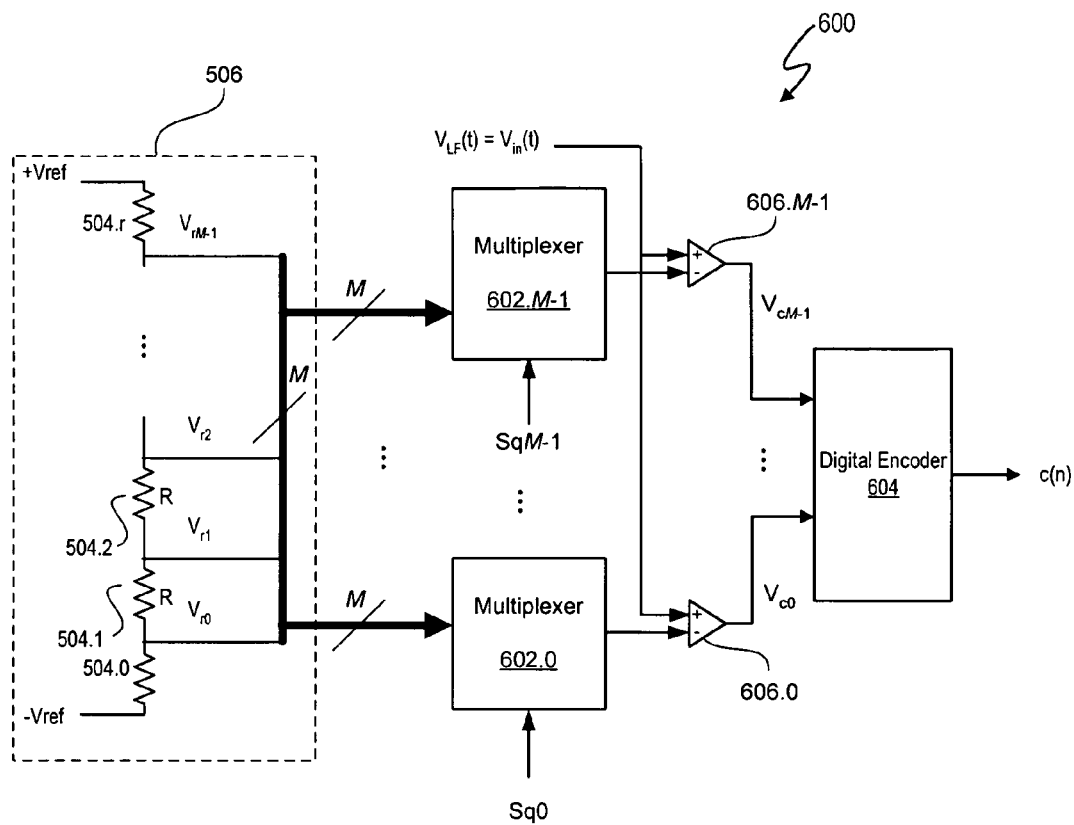
FIG. 6 depicts a consolidated computation module, DAC, and reduced comparator quantizer.

FIG. 6 depicts a consolidated embodiment 600 of computation module 414, DAC 412, and reduced comparator quantizer 402. Multiplexers 602.0 through 602.M−1 each select one (1) reference signal from reference signal generator 506 based on the value of the respective select signals $Sq_{est.0}$ through $Sq_{est.M-1}$. The respective select signals Sq0 through SqM−1 are set to each select one reference signal from the set of reference signals $V_{r0}, V_{r1}, \ldots, V_{rM-1}$ that will allow digital encoder 604 to determine the value of quantizer output signal q(n). M comparators 606.0 through 606.M−1 can determine a quantizer output signal from M+1 possible quantizer output signals.

For quantizer 600, in at least one embodiment, for an even number of comparators, the values of reference signals are $q_{est}+/-0.5$ for the center two comparators with step sizes of +/1 between adjacent comparators. For example, for M=2 comparators, the possible next quantizer output signals are members of the set $\{q_{est}-1, q_{est}, q_{est}+1\}$. Accordingly, select signals Sq0 and Sq1 are set to respectively select reference signals $V_{r0}$ and $V_{r1}$, and $V_{r1}$ and $V_{r1}$ in normalized quantization levels are equal to respectively $q_{est}-0.5$ and $q_{est}+0.5$. For M=4 comparators, the possible next quantizer output signals are members of the set $\{q_{est}-2, q_{est}-1, q_{est}, q_{est}+1, q_{est}+2\}$. Accordingly, select signals Sq0, Sq1, Sq2, and Sq3 are set to respectively select reference signals $V_{r0}, V_{r1}, V_{r2}$, and $V_{r3}$, and $V_{r0}, V_{r1}, V_{r2}$, and $V_{r3}$ in normalized quantization levels are equal to respectively $q_{est}-1.5$ and $q_{est}+0.5$, $q_{est}-0.5$, and $q_{est}+1.5$.

In at least one embodiment, for an odd number of comparators, the values of the center comparator is $q_{est}+0.5$ with step sizes of +/1 between adjacent comparators. For example, for M=3 comparators, the possible next quantizer output signals are members of the set $\{q_{est}-1, q_{est}, q_{est}+1,$ and $q_{est}+2\}$. Accordingly, select signals Sq0, Sq1, and Sq2 are set to respectively select reference signals $V_{r0}, V_{r1}$, and $V_{r2}$, and $V_{r0}, V_{r1}$, and $V_{r2}$ in normalized quantization levels are equal to respectively $q_{est}-0.5$, $q_{est}+0.5$, and $q_{est}+1.5$.

In a further example, for M=1 comparators, the possible next quantizer output signals are members of the set $\{q_{est}, q_{est}+1\}$. Accordingly, select signal Sq0 is set to select reference signal $V_{r0}$, and $V_0$ in a normalized quantization level is equal to $q_{est}+0.5$.

Quantization levels outside the maximum number of quantization levels N available in a delta sigma modulator need not be considered. Thus, predicted estimates $q_{est}+/-[X]$ should not exceed the available quantization levels. For example, for a 17 level system, normalized quantization levels below −8 and above +8 need not be considered.

The digital encoder 604 determines the preliminary quantizer output signal c(n) from the comparator output values $V_{c0}$ through $V_{cM-1}$ and determines the quantizer output signal q(n) in the same manner as described above with reference to quantizer 500.

Figure 7:
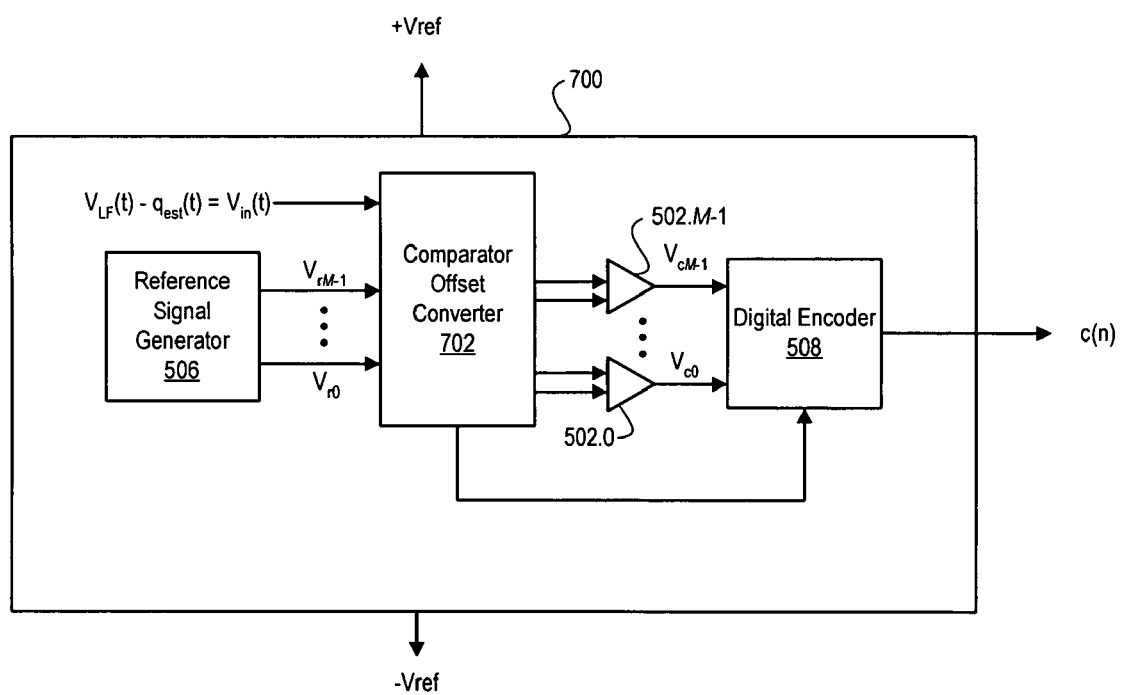
FIG. 7 depicts a reduced comparator quantizer with a comparator offset noise converter.

FIG. 7 depicts quantizer 700, which represents one embodiment of reduced comparator quantizer 402. Quantizer 700 includes comparator offset noise conversion as, for example, described in co-pending U.S. patent application Ser. No. 11/388,436, filed concurrently with this application, entitled "Delta Sigma Modulators with Comparator Offset Noise Conversion", inventor John L. Melanson, assignee Cirrus Logic, Inc., which is hereby incorporated by reference in its entirety.

During subsequent periods of time, comparator offset converter 702 alters "reference signal-to-comparator input terminal" associations to reroute respective reference signals $V_{r0}, V_{r1}, \ldots, V_{rM-1}$ from one arrangement of comparator input terminals of at least two (2) of the comparators 502 to a different arrangement of comparator input terminals. In at least one embodiment, the comparator offset converter 702 randomly changes the arrangement of comparator input terminals from one time period to the next time period. In other words, the comparator offset converter 702 randomly alters the reference signal-to-comparator input terminal associations during subsequent time periods. The comparator offset converter 702 can maintain a 1:1 reference signal-to-comparator input terminal relationship, i.e., one input terminal of each comparator receives one reference signal.

By maintaining the 1:1 ratio of reference signal-to-comparator input terminal and randomizing the reference signal-to-comparator input terminal associations, the comparator offset converter 702 effectively converts the comparator offset voltage nonlinearities into energies and frequencies that can be constructively processed and, in at least one embodiment, improve signal-to-noise ratios. In at least one embodiment, the comparator offset voltages are converted into additive multi-spectral noise, such as additive white noise. The multi-spectral noise can be part of system dithering or can be filtered out using, for example, a differential filter. Multi-spectral noise refers to noise whose energy is distributed among multiple frequencies with approximately equal energy levels. "White noise" is, in general, noise whose energy is approximately constant for each frequency within a given frequency range, such as 0 to ½ a delta sigma modulator sample rate.

In at least one embodiment, the comparator voltage offset reducer 702 alters the routing of reference signals to input terminals of the comparators 502.0 through 502.M−1 during subsequent periods of time. The comparator offset converter 702 includes one or more multiplexers to change which of the respective reference signals $V_{r0}, V_{r1}, \ldots, V_{rM-1}$ that each of the one or more comparators 502.0 through 502.M-1 receives during subsequent periods of time.

In at least one embodiment, the comparator voltage offset reducer 702 includes a chopping circuit. The chopping circuit includes multiplexers coupled to the input terminals of the comparators to effectively toggle the inputs of the comparators. The chopping circuit receives a random chopping control signal to cause the chopping circuit to randomly toggle the comparator input terminals. Toggling the comparator input terminals effectively converts the comparator offset voltage into additive multi-spectral noise, such as additive white noise. The chopping control signal can be exclusively OR'ed with each of the respective comparator outputs to restore proper polarity.

In another embodiment, randomizing the reference signal-to-comparator input terminal associations and chopping circuits can be respectively utilized with a subset of the comparators 502.0 through 502.M-1 in an embodiment of reduced comparator quantizer 402. For example, in one embodiment, only reference signals to adjacent pairs of comparators are randomly altered and/or only a limited number of comparator input terminals are randomly chopped. This limited scope of randomization and chopping has lower complexity implementation but achieves only limited offset related performance improvements.

In another embodiment, the chopping circuit and comparator offset converter are combined to obtain an even better whitening of the additive comparator offset.

The reference signal-to-comparator input terminal associations are communicated to digital encoder 508 so that digital encoder 508 can properly generate preliminary quantizer output signal q(n).

Figure 8:
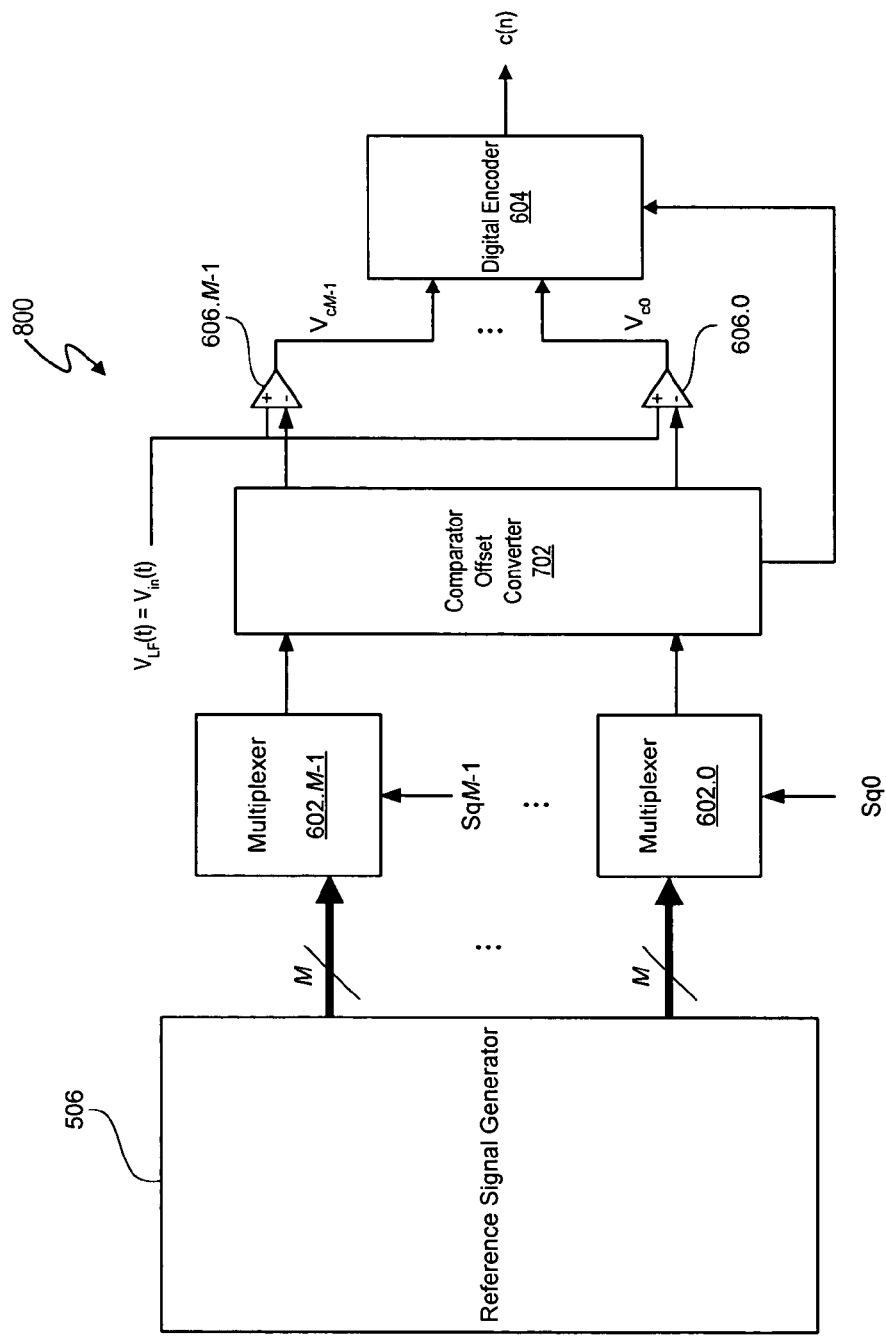
FIG. 8 depicts a consolidated computation module, DAC, and reduced comparator quantizer with a comparator offset noise converter.

FIG. 8 depicts consolidated embodiment 800, which represents one embodiment of consolidated embodiment 600. The consolidated embodiment 800 also includes comparator voltage offset reducer 702. Comparator voltage offset reducer 702 functions in the same manner with respect to consolidated embodiment 800 as described above with respect to quantizer 600. The reference signal-to-comparator input terminal associations are communicated to digital encoder 604 so that digital encoder 604 can properly generate quantizer output signal q(n).

Figure 9:
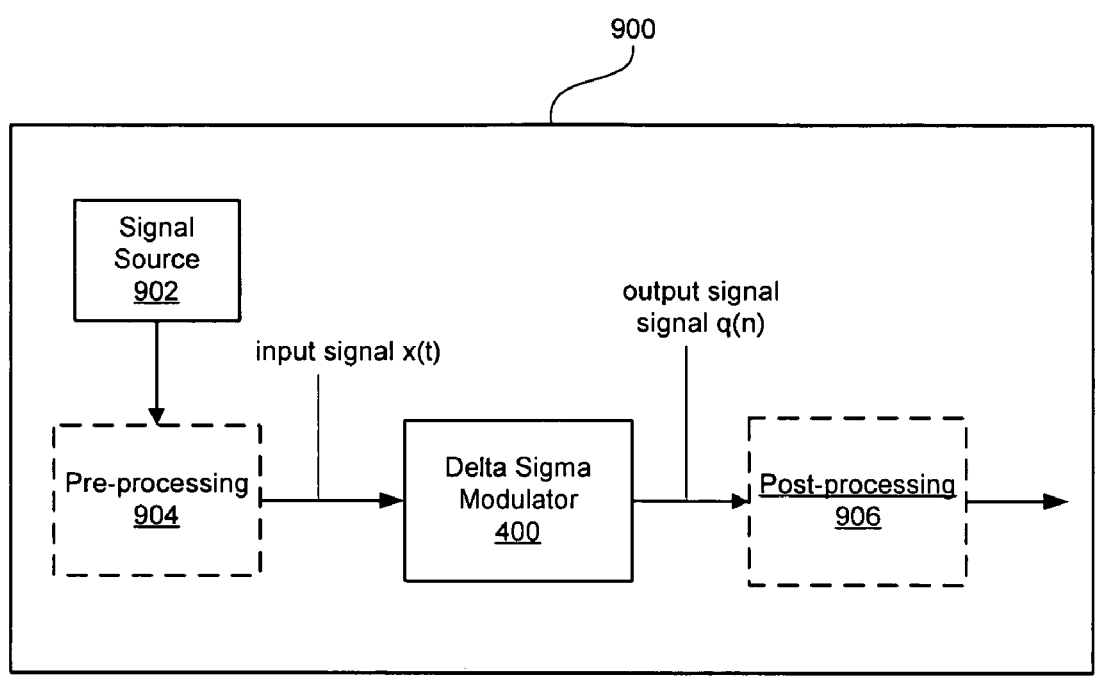
FIG. 9 depicts a signal processing system with a reduced comparator delta sigma modulator.

FIG. 9 depicts a signal processing system 900 that includes reduced comparator delta sigma modulator 400. The signal processing system 900 is particularly useful for high-end audio applications. Signal processing system 900 processes an input signal x(t) generated by an input signal source 902. The input signal x(t) may be an audio signal, a video signal, an audio plus video signal, and/or other signal type. The input signal x(t) is, for example, an analog signal generated by a microphone. Generally, input signal x(t) undergoes some preprocessing 904 prior to being modulated by delta sigma modulator 400. Example preprocessing includes low pass filtering to attenuate out-of-band signals. Signal processing system 900 also generally includes post-processing 906, such as low-pass filtering the output signals q(n). Additional post-processing can include recording of the averaged, digital output onto a recording medium or providing the averaged, digital output to a device that utilizes digital signals such as a digital audio recorder and/or player.

Although the present invention has been described in detail, it should be understood that various changes, substitutions and alterations can be made hereto without departing from the spirit and scope of the invention as defined by the appended claims.

What is claimed is:

1. A signal processing system comprising:
   an analog-to-digital delta sigma modulator comprising:
   a quantizer output predictor comprising a low pass filter to generate a predicted quantizer output signal, wherein the predicted quantizer output signal is an estimate of a quantizer input signal for time t based upon at least one or more previous delta sigma modulator output signals;
   a loop filter to generate a loop filter output signal for time t; and
   a quantizer, coupled to the loop filter, to generate a quantizer output signal based on the quantizer input signal, wherein the quantizer input signal comprises a difference between the loop filter output signal for time t and the predicted quantizer output signal for time t.

2. The signal processing system of claim 1 wherein the quantizer comprises:
   M comparators, wherein M represents a number of comparators determined from a maximum quantizer level deviation d, and the maximum quantizer level deviation d represents a maximum deviation of the loop filter output signal at time t from the predicted quantizer output signal for time t.

3. The signal processing system of claim 2 wherein M is determined in accordance with:

$M = \text{ceiling}(2*d)$ wherein d represents a maximum deviation of the loop filter output signal at time t from the predicted quantizer output signal for time t.

4. The signal processing system of claim 1 further comprising:
   a compensation module to correct the quantizer output signal with a digital version of the predicted quantizer output signal for time t and to generate a delta sigma modulator output signal q(n).

5. The signal processing system of claim 1 wherein the delta sigma modulator is configured to generate a delta sigma modulator output signal q(n) from the quantizer output signal, and the quantizer output predictor comprises a low pass filter to generate the predicted quantizer output signal for discrete time n based upon at least two past delta sigma modulator output signals determined prior to discrete time n.

6. The signal processing system of claim 1 wherein the quantizer output predictor comprises a low pass filter to average at least two previous delta sigma modulator output signals.

7. The signal processing system of claim 6 wherein the low pass filter is a finite impulse response filter having a filter function to determine the predicted quantizer output signal ($q_{est}$), wherein the filter function is a member of the group consisting of:

$$LPF = \frac{q(n-1) + q(n-2)}{2} \text{ and}$$

$$LPF = \frac{q(n-1) + q(n-2) + q(n-3) + q(n-4)}{4},$$

wherein "LPF" is the low pass filter output, "q(n−k)" represents the quantizer output signal immediately preceding quantizer output signal q(n−(k−1)), wherein k is an integer representing the amount of delay.

8. The signal processing system of claim 6 wherein the low pass filter is an infinite impulse response filter having a filter function to determine the predicted quantizer output signal ($q_{est}$), wherein the filter function is a member of the group consisting of:

$$LPF = \frac{1}{8}q(n-1) + \frac{7}{8}LPF(n-1), \text{ and}$$

$$LPF = \frac{1}{8}q(n-2) + \frac{7}{8}LPF(n-1),$$

wherein "LPF" is the low pass filter output, "q(n–k)" represents the quantizer output signal immediately preceding quantizer output signal q(n–(k–1)), wherein k is an integer representing the amount of delay.

9. The signal processing system of claim 1 wherein the predicted quantizer output signal $q_{est}$=floor(LPF+0.5) for an even number of comparators in the quantizer, and $q_{est}$=floor(LPF) for an odd number of comparators in the quantizer, and LPF is an output of the low pass filter.

10. The signal processing system of claim 1 further comprising:
a computation module, coupled to the quantizer output predictor and the loop filter, to determine the difference between the loop filter output signal for time t and the predicted quantizer output signal for time t.

11. The signal processing system of claim 1 wherein the delta sigma modulator has N quantization levels and the quantizer has M comparators, wherein N and M are integers and M<N.

12. The signal processing system of claim 1 wherein the quantizer further comprises:
a plurality of comparators, each of the comparators having an input terminal to receive the quantizer input signal and an input terminal to receive a respective reference signal; and
a comparator offset converter, coupled to the multiple comparators, to reroute respective reference signals from a first arrangement of comparator input terminals during a first time period to a second arrangement of comparator input terminals during a second time period.

13. A method of processing a signal using an analog-to-digital delta sigma modulator, the method comprising:
generating a predicted quantizer output signal with a low pass filter, wherein the predicted quantizer output signal is an estimate of a quantizer input signal for time t based upon at least one or more previous delta sigma modulator output signals;
generating a loop filter output signal for time t; and
generating a quantizer output signal based on the quantizer input signal, wherein the quantizer input signal comprises a difference between the loop filter output signal for time t and the predicted quantizer output signal for time t.

14. The method of claim 13 wherein generating the quantizer output signal further comprises generating the quantizer output signal using a quantizer that includes M comparators, M represents a number of comparators determined from a maximum quantizer level of deviation d, maximum quantizer level deviation d represents a maximum deviation of the loop filter output signal at time t from the predicted quantizer output signal for time t and M is determined in accordance with:

$$M = \text{ceiling}(2*d)$$

wherein d represents a maximum deviation of the loop filter output signal at time t from the predicted quantizer output signal for time t.

15. The method of claim 13 further comprising:
adding a digital version of the predicted quantizer output signal for time t to the quantizer output signal to generate a delta sigma modulator output signal q(n).

16. The method of claim 13 further comprising:
generating a delta sigma modulator output signal q(n) from a digital version of the predicted quantizer output signal for time t and the quantizer output signal.

17. The method of claim 13 further comprising:
generating a delta sigma modulator output signal q(n) from the quantizer output signal:
wherein generating a quantizer output signal further comprises generating the predicted quantizer output signal for discrete time n based upon at least two past delta sigma modulator output signals determined prior to discrete time n.

18. The method of claim 13 wherein generating a predicted quantizer output signal further comprises:
low pass filtering at least two previous delta sigma modulator output signals.

19. The method of claim 18 wherein low pass filtering at least two previous delta sigma modulator output signals comprises using a finite impulse response filter function to determine the predicted quantizer output signal ($q_{est}$), wherein the filter function is a member of the group consisting of:

$$LPF = \frac{q(n-1) + q(n-2)}{2} \text{ and}$$

$$LPF = \frac{q(n-1) + q(n-2) + q(n-3) + q(n-4)}{4},$$

wherein "LPF" is the low pass filter output, "q(n–k)" represents the quantizer output signal immediately preceding quantizer output signal q(n–(k–1)), wherein k is an integer representing the amount of delay.

20. The method of claim 18 wherein low pass filtering at least two previous delta sigma modulator output signals comprises using an infinite impulse response filter function to determine the predicted quantizer output signal ($q_{est}$), wherein the filter function is a member of the group consisting of:

$$LPF = \frac{1}{8}q(n-1) + \frac{7}{8}LPF(n-1), \text{ and}$$

$$LPF = \frac{1}{8}q(n-2) + \frac{7}{8}LPF(n-1),$$

wherein "LPF" is the low pass filter output, "q(n–k)" represents the quantizer output signal immediately preceding quantizer output signal q(n–(k–1)), wherein k is an integer representing the amount of delay.

21. The method of claim 13 wherein the predicted quantizer output signal $q_{est}$=floor(LPF+0.5) for an even number of comparators in the quantizer, and $q_{est}$=floor(LPF) for an odd number of comparators in the quantizer, and LPF is an output of the low pass filter.

22. The method of claim 13 further comprising:
receiving reference signals on a first arrangement of input terminals of respective comparators of the delta sigma modulator during a first period of time; and
rerouting the reference signals to a second arrangement of input terminals of the respective comparators of the delta sigma modulator during a second period of time.

23. A signal processing system comprising:
an analog-to-digital delta sigma modulator comprising:
an input to receive an input signal;
a filter coupled to the input; and
a quantizer coupled to the filter to quantize an output of the filter, wherein the quantizer comprises:
M comparators, wherein each comparator is configured (i) to receive the input signal, (ii) to receive a respective reference signal that approximates the input signal, and (iii) generate comparison data representing a comparison between the input signal and the received reference signal, wherein M is an even integer and $M \geq 2$; and
an N-level reference signal generator, coupled to the M-comparators, to (i) generate each respective reference signal based on content of the comparison data and (ii) provide each respective reference signal to the M comparators, wherein N is an integer and N>M.

24. The signal processing system of claim 23 wherein the N-level successive approximator further comprises:
processing modules having logic to limit each reference signal to within plus or minus a maximum expected deviation of the input signal from a predicted value quantization output value.

25. The signal processing system of claim 23 wherein the N-level successive approximator further comprises:
processing modules to process the comparison data and generate a select signal to select a value for each reference signal; and
a reference generator to receive the select signal and provide each reference signal to the M comparators.

26. The signal processing system of claim 25 wherein the reference generator comprises:
series coupled impedances; and
a multiplexer having multiple inputs coupled to receive respective voltage references generated across the impedances.

27. The signal processing system of claim 23 wherein each of the M comparators includes multiple inputs to receive a respective input signal and a respective reference signal, the signal processing system further comprising:
a comparator offset voltage reducer to change which of the respective reference signals that each of the M comparators receives during subsequent periods of time.

28. The signal processing system of claim 23 wherein the filter comprises continuous time filter components.

29. The signal processing system of claim 23 wherein the filter comprises discrete time filter components.

30. A method comprising:
receiving a quantizer input signal with first inputs of M comparators of a quantizer of an analog-to-digital delta sigma modulator, wherein M is an even integer and $M \geq 2$;
receiving a respective reference signal on each of second inputs of the M comparators;
generating comparison data with each of the M-comparators representing a comparison between the quantizer input signal and the respective reference signal; and
generating each reference signal, wherein the reference signal is based on content of the comparison data, the reference signal has one of N possible levels for each comparison, and N is an integer and N>M.

31. The method of claim 30 wherein generating each reference signal further comprises:
limiting each reference signal to within plus or minus a maximum expected deviation of the quantizer input signal from a value of a preceding quantizer input signal occurring in a past predetermined length of time.

32. The method of claim 30 wherein generating each reference signal further comprises:
processing the comparison data to generate a select signal to select a value for each reference signal;
receiving the select signal; and
providing each reference signal to the M comparators in accordance with the select signal.

33. The method of claim 30 wherein the quantizer input signal is a continuous time signal.

34. The method of claim 30 wherein the quantizer input signal is a discrete time signal.

35. The method of claim 30 wherein M equals a number of levels of an expected maximum quantization level variation of the input signal from an immediately preceding input signal.

36. An apparatus comprising:
means for receiving a quantizer input signal with first inputs of M comparators of a quantizer of an analog-to-digital delta sigma modulator, wherein M is an even integer and $M \geq 2$;
means for receiving a respective reference signal on each of second inputs of the M comparators;
means for generating comparison data with each of the M-comparators representing a comparison between the quantizer input signal and the respective reference signal; and
means for generating each reference signal, wherein the reference signal is based on content of the comparison data, the reference signal has one of N possible levels for each comparison, and N is an integer and N>M.

* * * * *